(12) United States Patent
Lee et al.

(10) Patent No.: US 10,082,576 B2
(45) Date of Patent: Sep. 25, 2018

(54) OPTICAL SENSOR SENSING ILLUMINANCE AND PROXIMITY

(71) Applicant: MagnaChip Semiconductor, Ltd., Cheongju-si (KR)

(72) Inventors: Yongsup Lee, Cheongwon-gun (KR); Daeho Lim, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 475 days.

(21) Appl. No.: 14/308,105

(22) Filed: Jun. 18, 2014

(65) Prior Publication Data

US 2015/0090866 A1    Apr. 2, 2015

(30) Foreign Application Priority Data

Sep. 27, 2013    (KR) ........................ 10-2013-0115007

(51) Int. Cl.
*G01S 17/08*    (2006.01)
*H01L 27/144*    (2006.01)
(Continued)

(52) U.S. Cl.
CPC ............ *G01S 17/08* (2013.01); *G01S 7/4816* (2013.01); *G01S 17/88* (2013.01);
(Continued)

(58) Field of Classification Search
CPC ........ G01S 17/88; G01S 17/08; G01S 7/4816; H01L 27/1443; H01L 27/14623;
(Continued)

(56) References Cited

U.S. PATENT DOCUMENTS 5,726,443 A    3/1998    Immega et al.
5,801,373 A *    9/1998    Oozu ................ H01L 27/14621
                                                                                                                                                                                                   250/208.1
(Continued)

FOREIGN PATENT DOCUMENTS

CN          102095495 A    6/2011
CN          102446911 A    5/2012
(Continued)

OTHER PUBLICATIONS

Chinese Office Action dated May 18, 2017 in counterpart Chinese Patent Application No. 201410510186.5 (26 pages, in Chinese with English translation).
(Continued)

*Primary Examiner* — John Lee
(74) *Attorney, Agent, or Firm* — NSIP Law

(57) ABSTRACT

An optical sensor includes photodiodes and optical filters that are arranged on the photodiodes. The photodiodes and optical filters may be spaced apart from each other. The optical filters include an infrared blocking filter and at least one visible light filter and the optical sensor measures a light quantity of a specific wavelength band in a visible light band through the photodiodes, wherein a specific visible light filter is arranged on the photodiodes. Therefore, the optical sensor has a simplified structure and may function as an ambient illuminance sensor, a proximity sensor, and a color sensor.

13 Claims, 4 Drawing Sheets

(a)

(b)

(51) Int. Cl.
*H01L 31/0232* (2014.01)
*G01S 17/88* (2006.01)
*G01S 7/481* (2006.01)
*H01L 27/146* (2006.01)

(52) U.S. Cl.
CPC .... *H01L 27/1443* (2013.01); *H01L 27/14621* (2013.01); *H01L 27/14623* (2013.01)

(58) Field of Classification Search
CPC ............. H01L 27/14621; H01L 27/146; H01L 31/0232; H01L 31/02327; H01L 27/144; H01L 27/1462; H01L 27/14601; H01L 27/1465; H01L 31/0216; H01L 31/02161; H01L 31/02162; H01L 31/02165
See application file for complete search history.

(56) References Cited

U.S. PATENT DOCUMENTS

| | | | | |
|---|---|---|---|---|
| 6,596,981 | B1* | 7/2003 | Aswell | H01L 27/1446 250/214.1 |
| 6,825,470 | B1* | 11/2004 | Bawolek | G02B 5/201 250/226 |
| 7,394,059 | B2* | 7/2008 | Fukuyoshi | G02B 3/0018 250/226 |
| 7,538,813 | B2* | 5/2009 | Wernersson | H04N 5/23212 348/208.99 |
| 7,714,265 | B2 | 5/2010 | Fadell et al. | |
| 7,990,444 | B2* | 8/2011 | Kudoh | H01L 27/14603 257/294 |
| 8,008,613 | B2 | 8/2011 | Tam | |
| 8,035,067 | B2* | 10/2011 | Toda | H01L 27/14603 250/208.1 |
| 8,100,552 | B2* | 1/2012 | Spero | B60Q 1/04 362/227 |
| 8,274,051 | B1 | 9/2012 | Aswell et al. | |
| 8,339,489 | B2* | 12/2012 | Choe | G06T 3/4015 250/339.05 |
| 8,593,563 | B2* | 11/2013 | Shintani | H01L 27/14621 348/272 |
| 8,600,430 | B2* | 12/2013 | Herz | G06F 1/3203 455/456.1 |
| 8,723,123 | B2* | 5/2014 | Kalnitsky | G01J 1/1626 250/338.4 |
| 8,872,093 | B2* | 10/2014 | Lee | G09G 3/20 250/208.1 |
| 8,878,132 | B2* | 11/2014 | Hsu | G01J 1/0437 250/338.4 |
| 8,907,802 | B2* | 12/2014 | Erdtmann | G08B 17/107 250/573 |
| 8,922,683 | B2* | 12/2014 | Hayashi | H01L 27/14621 348/275 |
| 9,129,548 | B2* | 9/2015 | Zheng | G09G 5/10 |
| 2003/0112353 | A1* | 6/2003 | Morris | H04N 5/332 348/310 |
| 2003/0132369 | A1 | 7/2003 | Aswell et al. | |
| 2005/0133690 | A1* | 6/2005 | Higashitsutsumi | H01L 27/14621 250/208.1 |
| 2005/0133693 | A1* | 6/2005 | Fouquet | G01J 3/10 250/214 R |
| 2006/0177129 | A1* | 8/2006 | Matsuyama | H04N 5/332 382/167 |
| 2007/0201738 | A1* | 8/2007 | Toda | H04N 9/045 382/144 |
| 2008/0006762 | A1 | 1/2008 | Fadell et al. | |
| 2008/0191298 | A1* | 8/2008 | Lin | G01J 1/4204 257/432 |
| 2008/0237453 | A1* | 10/2008 | Chen | G01J 3/51 250/226 |
| 2010/0243899 | A1* | 9/2010 | Ovsiannikov | G03B 13/02 250/339.02 |
| 2010/0252871 | A1* | 10/2010 | Kalnitsky | H01L 27/1443 257/292 |
| 2010/0282953 | A1* | 11/2010 | Tam | G01J 1/1626 250/226 |
| 2010/0314543 | A1* | 12/2010 | Lee | G01J 3/02 250/330 |
| 2011/0108708 | A1* | 5/2011 | Olsen | G02B 3/0062 250/208.1 |
| 2011/0235017 | A1* | 9/2011 | Iwasaki | H04N 5/2354 356/4.01 |
| 2011/0298766 | A1* | 12/2011 | Tam | G01J 1/1626 345/207 |
| 2012/0187513 | A1* | 7/2012 | Holenarsipur | H01L 27/14621 257/432 |
| 2013/0193311 | A1* | 8/2013 | Yoshida | H04N 9/045 250/208.1 |
| 2014/0131576 | A1* | 5/2014 | Park | G01J 1/0492 250/338.1 |
| 2014/0312234 | A1* | 10/2014 | Tan | G01J 1/4228 250/349 |
| 2015/0090866 | A1* | 4/2015 | Lee | G01S 17/88 250/226 |

FOREIGN PATENT DOCUMENTS

CN 103314281 A 9/2013
TW 201237713 A 9/2012

OTHER PUBLICATIONS

Taiwanese Office Action dated Oct. 24, 2017 in counterpart Taiwanese Patent Application No. 10621077300 (10 pages, in Chinese).

* cited by examiner

200

(a)

(b)

OPTICAL SENSOR SENSING ILLUMINANCE AND PROXIMITY

CROSS-REFERENCE TO RELATED APPLICATIONS

This application claims the benefit under 35 USC 119(a) of Korean Patent Application No. 10-2013-0115007 filed on Sep. 27, 2013, in the Korean Intellectual Property Office, the entire disclosure of which is incorporated herein by reference for all purposes.

BACKGROUND OF THE INVENTION

1. Field

The following description relates to an illuminance and proximity sensor. The following description also relates to an optical sensor using an infrared blocking filter and a visible light filter to measure an illuminance for a specific wavelength and based on a distance of an object.

2. Description of Related Art

An optical sensor is a type of apparatus that operates by responding to a light source. The light source for the optical sensor corresponds to all of the light sources that generate light received by the optical sensor, including infrared light and visible light. When light from a light source is incident on a surface of the optical sensor from the light source, the optical sensor may absorb incident light energy to convert the absorbed light energy into an electrical signal.

For example, such an optical sensor may be used as a proximity sensor or an ambient illuminance sensor, such as in a portable device, for example, a smart phone.

In one example, an integrated proximity sensor and an optical sensor include an emitter, a filter and sensors. In this example, the sensors include a brightness detection sensor that detects an ambient light brightness and an infrared detection sensor that responds to an infrared ray by using an infrared pass filter.

The infrared detection sensor detects an infrared ray of a light that is emitted from the emitter so as to be reflected on an object located in the path of the light emitted by the emitter to measure whether such an object exists and a distance of the corresponding object. The infrared detection sensor also measures an ambient infrared ray.

The brightness detection sensor detects both the visible light and the infrared ray. Therefore, the optical sensor requires an operation, such as a subtraction or difference operation, between values detected by the brightness detection sensor and the infrared detection sensor in order to detect and consider only visible light.

In another example, related to an optical sensor using an infrared (IR) cutoff filter, the optical sensor includes three sensors, an infrared blocking filter and an optical filter that passes or blocks only a specific wavelength of a light.

In this example, a first sensor may include the optical filter and the infrared blocking filter to block visible light and an infrared ray in order to measure a luminosity of a specific wavelength band of the visible light. A second sensor may include the infrared blocking filter on a top of the second sensor to block the infrared ray of the light and to measure the luminosity of the visible light alone. A third sensor may not include any filter so as to measure a total luminosity of the visible light and infrared ray.

However, the infrared blocking filter included in the first and second sensors alternately deposits two materials, for example, $TiO_2$ and $SiO_2$, as deposited layers, where a refractive index is different each other through a vacuum thin film deposition technique. However, such a technique causes a situation in which a manufacturing cost is increased according to using a greater quantity of the infrared blocking filter.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The present examples provide an optical sensor technique that measures an illuminance of a specific wavelength band to perform a color balancing.

The present examples provide an optical sensor technique that simplifies an optical sensor structure in order to decrease a manufacturing cost of an optical sensor.

The present examples also provide an optical sensor technique that increases performance for measurement of an illuminance and a distance of an object.

In one general aspect an optical sensor includes photodiodes and optical filters arranged on at least one of the photodiodes, wherein the optical filters include an infrared blocking filter and at least one visible light filter, and wherein the optical sensor is configured to measure a light quantity of a specific wavelength band in a visible light band through the photodiodes, wherein a specific visible light filter is arranged on a photodiode.

The photodiodes may be spaced apart from each other and the optical filters may be spaced apart from each other.

The at least one visible light filter may include an infrared pass filter configured to block visible light and to pass an infrared ray, and a color filter configured to pass the specific wavelength band from the visible light band.

The color filter may include red, green and blue filters configured to respectively pass monochromatic light corresponding to a red color, a green color, and a blue color, and the red, green, and blue filters may be laid upon each other to form the infrared pass filter.

The photodiodes may include a first photodiode configured to measure a light quantity of the infrared ray, wherein the infrared pass filter is arranged on the first photodiode, a second photodiode configured to measure a light quantity of a white light, wherein the infrared blocking filter is arranged on the second photodiode, and a third photodiode configured to measure a light quantity of the specific wavelength band of the visible light band and the infrared ray, wherein the color filter is arranged on the third photodiode, and wherein the optical sensor performs a difference operation for a measured value measured through the first and third photodiodes to measure an illuminance of the specific wavelength band.

The photodiodes may include a first photodiode configured to measure a light quantity of the specific wavelength band of the visible light and the infrared ray, wherein the color filter is arranged on the first photodiode, a second photodiode configured to measure a light quantity of a white light, wherein the infrared blocking filter is arranged on the second photodiode, and a third photodiode, wherein optical filters are not arranged on the third photodiode, wherein the optical sensor performs a first difference operation between second and third measured values measured through the second and third photodiodes to measure a distance and performs a second difference operation between a result of the first difference operation and a first measured value measured through the first photodiode to measure an illuminance of a specific wavelength.

In another general aspect, an optical sensor includes a first photodiode configured to measure a light quantity of a white light, wherein an infrared blocking filter is arranged on the first photodiode, and a second photodiode, wherein the optical sensor measures an ambient illuminance and a distance of an object based on measured values measured through the first and second photodiodes.

No optical filter may be arranged on the second photodiode.

An infrared pass filter may be arranged on the second photodiode that passes an infrared ray, and the second photodiode may measure a light quantity of the infrared ray.

In another general aspect, an optical sensor includes a first photodiode configured to measure a first measured value including a light quantity of an infrared ray, wherein a first visible light filter is arranged on the first photodiode, and a second photodiode configured to measure a second measured value including a dark current of the second photodiode, wherein a second visible light filter and an infrared blocking filter are arranged on the second photodiode, and wherein the optical sensor performs a difference operation between the first and second measured values to measure an adjusted distance of an object.

The first and second visible light filters may be infrared pass filters that pass an infrared band of a light.

The optical sensor may further include a third photodiode configured to measure a third measured value including a light quantity for a specific wavelength of a visible light wherein a color filter is arranged on the third photodiode and pass a specific wavelength band of a visible light band of a light, wherein the optical sensor performs a difference operation between the third measured value and the first measured value to further measure an adjusted illuminance for a specific wavelength.

The optical sensor may further include a fourth photodiode where an optical filter is not arranged, wherein the optical sensor performs a difference operation between a fourth measured value measured through the fourth photodiode and the first measured values to measure an adjusted ambient illuminance.

The optical sensor may further include a third photodiode, wherein no optical filter is arranged on the third photodiode, wherein the optical sensor performs a difference operation between the first measured value and a third measured value measured through the third photodiode to further measure an adjusted ambient illuminance.

The first and second visible light filters may be color filters passing a specific wavelength band of a visible light band of a light source.

The optical sensor may further include a third photodiode, wherein no optical filter is arranged on the third photodiode, wherein the optical sensor measures an illuminance of a specific wavelength based on the second measured value and measures an ambient illuminance based on the first measured value, the second measured value, and a third measured value measured through the third photodiode.

The optical sensor may further include a third photodiode on which an optical filter is not arranged, wherein the first visible light filter corresponds to an infrared pass filter passing infrared band and the second visible light filter corresponds to a color filter passing a specific wavelength band of a visible light band.

In another general aspect, a method of using an optical sensor includes measuring a quantity of light in an infrared ray received through a first photodiode where an infrared pass filter is arranged, measuring a quantity of visible light received through a second photodiode where an infrared blocking filter is arranged, and measuring the ambient illuminance and the position of an object based on the measured infrared ray and measured visible light.

The method may further include measuring a quantity of monochromatic light for a specific wavelength of visible light received through a third photodiode when a color filter is arranged, and performing a color balancing using the quantity of monochromatic light.

The optical sensor may further include measuring a quantity of light receive through a third photodiode on which an optical filter is not arranged, and correcting for a dark current using the quantity of light received through the third photodiode.

Examples provide certain features, discussed further below. For example, some examples measure an illuminance of a specific wavelength band through a color filter passing the specific wavelength band of a visible light band to perform a color balance. Also, some examples arrange an infrared blocking filter on only one photodiode to simplify an optical sensor structure and to decrease a manufacturing cost of an optical sensor. Furthermore, some examples of the present invention measure a dark current of a photodiode to accurately measure an illuminance and distance of an object based on a visible light filter and infrared blocking filter. Here, a dark current refers to a relatively small electrical current that flows through the photodiode when no photons are entering the device.

Other features and aspects will be apparent from the following detailed description, the drawings, and the claims.

Figure 1:
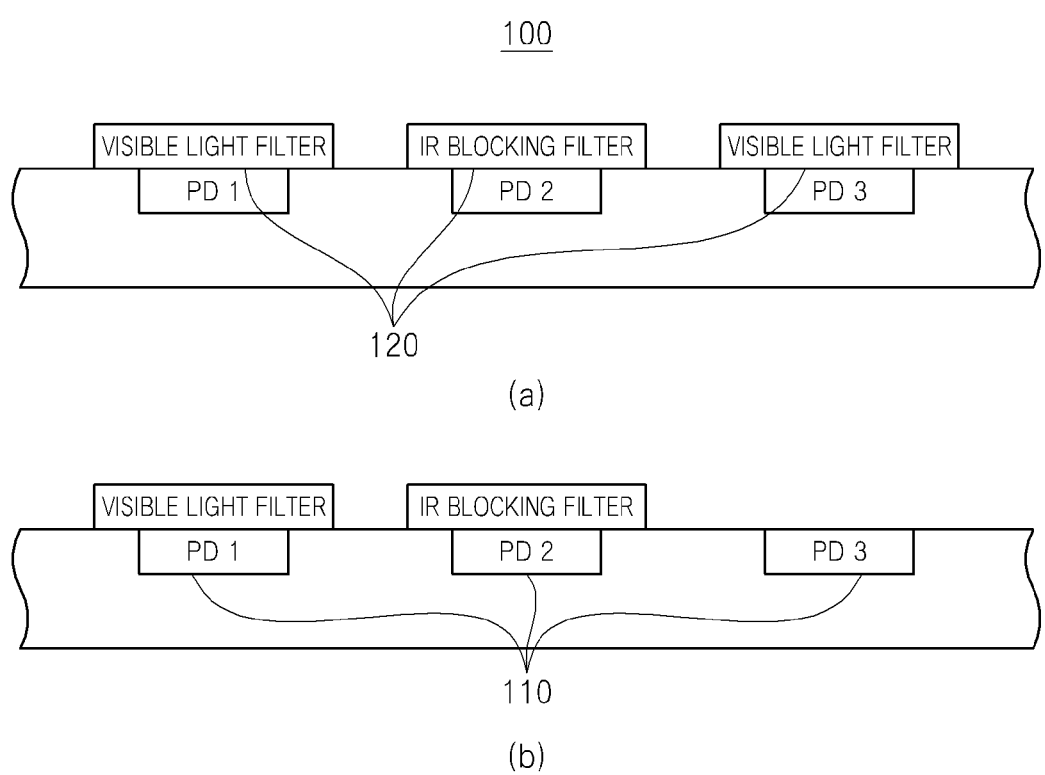
FIG. 1 is a schematic diagram illustrating an optical sensor according to one example.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Terms described in the present disclosure may be understood as follows.

While terms such as "first" and "second," etc., are used to describe various components, such components are not intended to be understood as being limited to the above terms. The above terms are used only to distinguish one component from another. For example, a first component is potentially referred to as a second component without departing from the scope of the present examples, and likewise a second component is potentially referred to as a first component.

When an element is referred to as being "connected to" another element, this includes examples in which the element be directly connected to the other element as well as examples in which intervening elements are also present. In contrast, when an element is explicitly referred to as being "directly connected to" another element, no intervening elements are intended to be present. In addition, unless explicitly described to the contrary, the word "comprise" and related variations such as "comprises" or "comprising," are intended to imply the inclusion of stated elements but not the exclusion of any other elements. Meanwhile, other expressions describing relationships between components such as "~ between", "immediately ~ between" or "adjacent to ~" and "directly adjacent to ~" are construed similarly in that they are used to imply a relationship between components without further limiting examples, unless explicitly described to the contrary.

Singular forms "a", "an" and "the" in the present disclosure are intended to include the plural forms as well, unless the context clearly indicates otherwise. Likewise terms such as "including" or "having," etc., are intended to indicate the existence of the features, numbers, calculations, actions, components, parts, or combinations thereof disclosed in the specification, and are not intended to preclude the possibility that one or more other features, numbers, calculations, actions, components, parts, or combinations thereof exist or are added in other examples.

In describing the elements of the present invention, terms such as first, second, A, B, (a), (b), etc., may be used. Such terms are merely used for discriminating between the corresponding elements from other elements and to better convey relationships between the elements. Therefore, even when such terms are used, the corresponding elements are not limited in their essence, sequence, or precedence by the terms.

The terms used in the present application are merely used to describe particular examples, and are not intended to limit the present examples. Unless otherwise defined, all terms used herein, including technical or scientific terms, are presumed to have the same meanings as those generally understood by those with ordinary knowledge in the field of art to which the present examples belong. Thus, such terms as those defined in a generally used dictionary are to be further interpreted to have the meanings equal to the contextual meanings in the relevant field of art. Hence, terms are not to be interpreted to have ideal or excessively formal meanings unless clearly defined as such in the present application.

When a "difference operation" is referred to, it denotes obtaining the difference of the operands it applies to. Thus, if a "difference operation" is performed on A and B, it means that the result of subtracting B from A is the intended meaning of performing the "difference operation."

In one example, an optical sensor includes photodiodes that are spaced apart from each other and optical filters that are arranged on the photodiodes and are spaced apart from each other. Herein, the optical filters include an infrared blocking filter and at least one visible light filter. The optical sensor measures a light quantity of a specific wavelength band in a visible light band through the photodiodes wherein a specific visible light filter is arranged on the photodiodes.

FIG. 1 is a schematic diagram illustrating an optical sensor according to one example.

Referring to FIG. 1, the optical sensor 100 includes three photodiodes 110 and optical filters 120.

First, the photodiode and the optical filters are described further.

The photodiode converts light energy to electric energy. In an example, the photodiode includes optical detection functionality in a PN junction part and uses a photoelectric effect where an electron and a hole charge is generated and a current flow when a light reaches in a diode. A PN junction is a boundary or interface between a p-type semiconductor material and an n-type semiconductor material. The p-type semiconductor material and the n-type semiconductor material each include a semiconductor which has been doped to include an impurity that changes their conductive properties. Herein, a photovoltaic effect indicates a phenomenon where a voltage is generated on the PN junction part of the photodiode through the photoelectric effect. The photoelectric effect is the physical phenomenon that many metals emit electrons when light shines on the metal. Because the parts of the PN junction have been doped to have conductive properties, the doping causes the PN junction to emit electron and hole charges when light is incident upon the PN junction.

In one example, photodiodes 110 may respectively correspond to a PIN diode or Avalanche Photo Diode (APD Diode). The PIN diode corresponds to a diode where an intrinsic semiconductor layer is installed in the middle of the PN junction part. At one end of the diode, there is a heavily doped p-type semiconductor junction and at the other end of the diode, there is a heavily doped n-type semiconductor junction. In such an example, the doping is potentially heavy so that the junctions obey Ohm's Law. The intrinsic semiconductor has characteristics that a quantity of carriers is small and a resistance is large In another example, the APD diode is a highly sensitive semiconductor electronic device that also uses the photoelectric effect to convert light to electricity. The APD diodes are photodetectors that provide a built-in first stage of gain through avalanche multiplication. Avalanche multiplication is a type of electron avalanche in which a chain reaction occurs when free electrons accelerate other electrons which in turn accelerate other electrons. From a functional standpoint, APD diodes are a semiconductor analog to photomultipliers. In the example of FIG. 1, the photodiodes 110 respectively measure a light quantity for a specific component of a light according to the plurality of the optical filters arranged on top of the sensors.

Herein, the light may be generated from a light source located outside such as sunlight, or be emitted from a light source in the optical sensor 100 and be reflected by an external object.

The optical filters include an infrared blocking filter blocking an infrared ray band and a visible light filter blocking or passing at least a portion of visible light. In a particular example, the infrared blocking filter corresponds to a filter that blocks an infrared portion of the light. Thus, in an example the infrared blocking filter generally blocks a light corresponding to a 780 nm through 3000 nm wavelength. However, in other examples the infrared blocking filter blocks infrared light with other, similar wavelengths. For example, infrared light includes near infrared, mid infrared and far infrared, and the infrared blocking filter is designed to filter only a subset of these types of infrared light.

The visible light filter blocks all of the visible light band of the light or passes only a specific wavelength band of the light. For example, such a specific wavelength band is monochromatic light, in that if light is restricted a specific wavelength, it is all of one color. Herein, the visible light, commonly referred to simply as light, is electromagnetic radiation that is visible to the human eye, and is the information involved in the human sense of sight. Visible light is usually defined as having a wavelength in the range of 380 nm to 780 nm. In the case monochromatic light, visible light is typically considered to be red light, green light, or blue light. For example, a red light is usually defined as having a wavelength in the range of 610 nm to 700 nm, a green light is usually defined as having a wavelength in the range of 500 nm to 570 nm and a blue light is usually defined as having a wavelength in the range of 450 nm to 500 nm. However, other ranges of wavelengths may be used as potential candidates of light for other colors of light that are used as monochromatic light.

In one example, the visible light filter includes an infrared pass filter as well as a color filter for visible light. Herein, the infrared pass filter blocks a visible light band of the light and passes an infrared ray band of the light and the color filter passes only a specific wavelength band of the visible light band.

For example, when the visible light filter blocks all of the visible light, including wavelengths in the range of 380 nm to 780 nm, the visible light filter passes the infrared ray only. Hence, the visible light filter functions as an infrared pass filter or a black filter, in that the only light that penetrates it is the infrared light. On the other hand, when the visible light filter passes the monochromatic light corresponding to a specific color, such as red, green, or blue, the visible light filter corresponds to a band pass filter. For example, the visible light filter is a red pass filter, a green pass filter or a blue pass filter. Because the visible light filter only allows the passage of one color, it is hereinafter referred to as a color filter. The color filter passes either the specific wavelength band of the visible light or another component such as the infrared ray.

In one example, the visible light filter has a structure in which at least one color filter is included. When heterogeneous color filters are laid, the visible light filter corresponds to the infrared pass filter. For example, the red filter and the blue filter are laid to form the infrared pass filter. The red filter only allows the passage of red light and infrared light and the blue filter only allows the passage of blue light and infrared light. Hence, the only light that penetrates both red and blue filters is infrared light.

Hereinafter, a light resulting from passing all of the visible light band is referred as a white light and a light resulting from passing a specific monochromatic light of the visible light band is referred to as a red light, a green light or a blue light according to the color of the passed monochromatic light.

The optical sensor 100 measures a light quantity of the visible light or the specific wavelength band, in the case of monochromatic light, of the visible band through using the photodiodes 110 on which the plurality of the optical filters are arranged or are not arranged. In one example the optical sensor 100 measures a distance of a specific object and an ambient illuminance. In another example, the optical sensor 100 or performs a color balance or white balance based on the measured light quantity. Herein, the color balance electrically adjusts a color temperature of the light to represent a white color as a substantially white color. The color temperature of a light source is the temperature of an ideal black-body radiator that radiates light of comparable hue to that of the light source. For example, when a camera photographs an object, an image may be red-colored under an incandescent light and be green-colored under a fluorescent light. In this case, the optical sensor 100 may perform a color balance on a light being passed through the sensor based on an appropriate algorithm to correct for the temperature associated with the light source.

When the optical sensor 100 uses a light quantity of an infrared ray to measure a distance of a specific object, the optical sensor 100 is used as a proximity sensor. When the optical sensor 100 uses a light quantity of white light to measure an ambient illuminance, the optical sensor 100 is used as an ambient illuminance sensor. Also, when the optical sensor 100 uses a light quantity of monochromatic light, the optical sensor 100 is used as a color sensor, also referred to as an RGB sensor, that performs the color balancing or the white balancing.

Referring to FIG. 1, at (a), the infrared blocking filter is arranged on a top of a second photodiode PD 2 and the visible light filter is arranged on a top of first and third photodiodes PD 1 and PD 3. In this example, a first visible light filter arranged on the first photodiode PD 1 corresponds to the infrared pass filter and a second visible light filter arranged on the third photodiode PD 3 corresponds to the color filter. On the other hand, in another example the first visible light filter corresponds to the color filter and the third visible light filter corresponds to the infrared pass filter.

In this example, the second photodiode PD 2 measures a light after blocking a light quantity of the infrared ray. That is, the second photodiode PD 2 measures a light quantity of the white light or the visible light of the light. As a result, the optical sensor 100 measures the ambient illuminance based on such a second measured value measured through the second photodiode.

The first photodiode PD 1 measures the light quantity associated with the infrared ray and the optical sensor 100 measures the distance of the specific object based on the measured light quantity of the infrared ray.

As described above, the optical sensor 100 includes a specific light source, such as an LED light source. The optical sensor 100 emits the light outside through the specific light source to receive a reflected infrared ray of the emitted light and to thereby measure the distance of the specific object.

The optical sensor 100 measures a light quantity of the specific wavelength, that is, the monochromatic light, and the infrared ray in combination as a third measured value through the third photodiode PD 3. The optical sensor perform a difference operation between the third measured value and a first measured value measured through the first photodiode PD 1 to measure only a light quantity for the specific wavelength band by excluding the infrared light.

For example, when the color filter arranged on the third photodiode PD 3 corresponds to the red filter, the third measured value includes the red light and the infrared ray and the optical sensor 100 measures a light quantity of a red light component by performing a difference operation between the first and third measured values.

Therefore, the optical sensor 100 is potentially used as an ambient illuminance sensor, a proximity sensor, and/or a color sensor. For example, the color sensor performs the color balancing by an illuminance measurement of the specific wavelength corresponding to the appropriate color.

Referring to FIG. 1 at (b), the third photodiode PD 3 does not include a visible light filter. In this case, the optical sensor 100 is used as an ambient illuminance sensor, a proximity sensor and a color sensor through an appropriate operation between the first and third measured value.

In FIG. 1 at (b), the visible light filter arranged on the first photodiode PD 1 corresponds to the color filter. The first photodiode PD 1 measures the light quantity of the specific wavelength, that is, the monochromatic light and the infrared ray through the color filter. The second photodiode PD 2 measures the light quantity of the white light. The optical filters are not arranged on the third photodiode PD 3 and the third photodiode PD 3 thus measures the combined light quantity of the white light and the infrared ray.

As described in FIG. 1 at (a), the optical sensor 100 measures an ambient illuminance based on the second measured value measured through the second photodiode PD 2.

The optical sensor 100 performs a first difference operation between the second and third measured value measured through the second photodiode PD 2 and third photodiode PD 3. In an example, the calculation is the infrared ray value=the third measured value−the second measured value to produce information about the infrared ray used to measure the distance of the object. Furthermore, the optical sensor 100 may perform a second difference operation between a result of the first difference operation and the first measured value measured through the first photodiode to measure the illuminance of the specific wavelength. In an example, this calculation is be the illuminance value=the first measured value−the infrared ray value.

Thus, the optical sensor 100 is potentially used as an ambient illuminance sensor, a proximity sensor, and/or a color sensor. Also, the infrared blocking filter is arranged on only one photodiode so that a structure of the optical sensor 100 is simplified and a manufacturing cost of the optical sensor 100 is decreased.

In another example, the optical sensor 100 includes a first photodiode PD 1 and a second photodiode PD 2. The first photodiode PD 1 arranges the infrared blocking filter to measure the light quantity of the white light and the second photodiode PD 2 does not arrange the optical filter. In such an example, the optical sensor 100 measures the ambient illuminance and the distance of the object based on the measured values measured by the first and second photodiodes.

Figure 2:
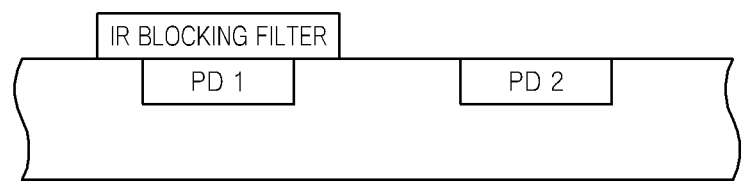
FIG. 2 is a schematic diagram illustrating an optical sensor according to another example.
Figure 2:
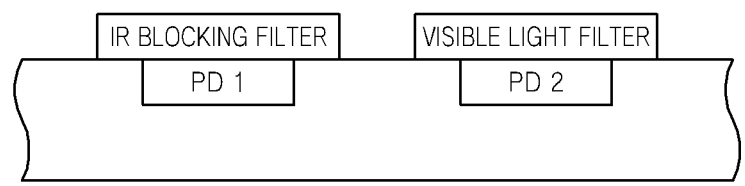

FIG. 2 is a schematic diagram illustrating an optical sensor according to another example.

Referring to FIG. 2 at (a), an optical sensor 200 includes two photodiodes.

In FIG. 2, at (a), the infrared blocking filter is arranged on a first photodiode PD 1 and a second photodiode PD 2 does not have arranged upon it an optical filter.

In such an example, the optical sensor 200 measures the light quantity of the white light through the first photodiode PD 1 as a first measured value and measures the ambient illuminance based on the first measured value. Furthermore, the optical sensor 200 measures the light quantity of the white light and the infrared ray through the second photodiode as a second measured value and calculates the light quantity of the infrared ray using a difference operation between the first and second measured value. For example, the infrared value=the second measured value−the first measured value. Therefore, the optical sensor 200 of FIG. 2 at (a) detects only the infrared ray of the light to measure the distance of the object.

Referring to FIG. 2 at (b), in comparison with FIG. 2 at (a), the second photodiode PD 2 further includes a visible light filter arranged on its top. As provided in FIG. 2 at (b), the visible light filter arranged on a top of the second photodiode PD 2 corresponds to the infrared pass filter or the color filter. In order to measure the infrared ray, the second photodiode PD 2 corresponds to the infrared pass filter.

The optical sensor 200 measures the light quantity of the infrared ray through the second photodiode PD 2 as a second measured value and measures the distance of the object based on the second measured value. Therefore, the optical sensor 200 measures the ambient illuminance and the distance of the object without a specific operating procedure, based on the above information.

Figure 3:
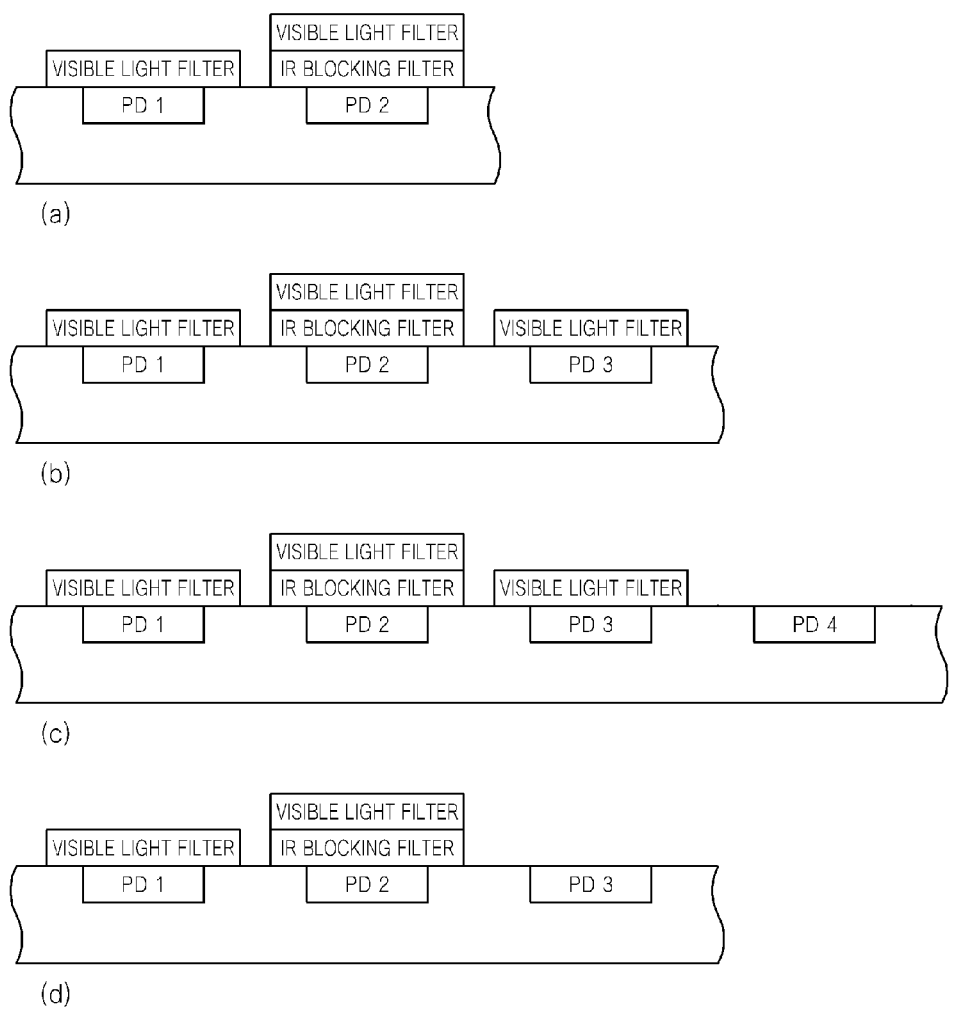
FIG. 3 is a schematic diagram illustrating an optical sensor that compensates for a dark current of a photodiode.

FIG. 3 is a schematic diagram illustrating an optical sensor compensating for a dark current of a photodiode.

Referring to FIG. 3 at (a), an optical sensor 300 includes two photodiodes.

A first visible light filter is arranged on the first photodiode PD 1. The infrared blocking filter and the visible light filter are laid to both be arranged on the second photodiode PD 2. Herein, a laying sequence of the infrared blocking filter and the visible light filter laid on the second photodiode PD 2 includes a sequence in which the infrared blocking filter is on top of the visible light filter, and a sequence in which the visible light filter is on top of the infrared blocking filter.

The visible light filter is an infrared pass filter or a band pass filter, depending on which types of visible light it filters. In an example, in order to compensate for a dark current of a photodiode, the visible light filter corresponds to the infrared pass filter. In such an example, the dark current corresponds to a current flowing in a state where there is no incident light that is generated due to a heat effect and an insulation fault of the photodiode.

In one example, the first and second visible light filters correspond to the infrared pass filter that passes the infrared ray band of the incident light. In such an example, the optical sensor 300 measures the first measured value including the light quantity of the infrared ray that passes through the first photodiode. In this example, the first measured value includes a dark current, as discussed above.

In this example, the optical sensor 300 measures the second measured value including the dark current through the second photodiode. The optical sensor 300 performs a compensation operation for the second measured value with respect to the first measured value. For example, the compensation operation is a difference operation, found by infrared ray light value=the first measured value−the second measured value. Such a compensation operation is used to calculate the light quantity for the only infrared ray. By performing such a calculation, it becomes possible to accurately measure a position of the object based on the measured light quantity only for the infrared ray. For example, the calculation determines an adjusted distance of the object.

Referring to FIG. 3 at (b), the optical sensor 300 further includes a third photodiode where the visible light filter is arranged on the third photodiode. Herein, the visible light filter arranged on the third photodiode corresponds to the infrared pass filter or the color filter, and is thus an infrared pass filter or a band pass filter. In order to measure the light quantity for the specific wavelength, that is, the monochromatic light, the visible light filter is a color filter.

In comparison with FIG. 3 at (a), the optical filter 300 measure a third measured value including the light quantity for the specific wavelength and the infrared ray through the third photodiode. As described in FIG. 3 at (a), the third measured value in this example includes the dark current.

In this example, the optical sensor 300 performs a difference operation that removes the first measured value from the third measured value. By performing such an operation, in this example the optical sensor 300 removes the infrared ray, including the dark current, to measure the light quantity for only a specific wavelength, that is, the monochromatic light, and functions as the color sensor.

Referring to FIG. 3 at (c), the optical sensor 300 further includes a fourth photodiode PD 4 in which no optical filter is arranged. In comparison with FIG. 3 at (b), the optical sensor in FIG. 3 at (c) 300 measures the light quantity of the visible light and the infrared ray through the fourth photodiode PD 4 as the fourth measured value. Herein, the fourth measured value also includes the dark current as above described.

Thus, in FIG. 3 at (c), the optical sensor 300 performs a difference operation that removes the first measured value from the fourth measured value to measure the light quantity of the white light where the dark current is removed. Such a measurement produces the adjusted ambient illuminance and allows the optical sensor 300 to function as an ambient illuminance sensor. In FIG. 3 at (c), the optical sensor 300 also includes the proximity sensor and color sensor functions as discussed above.

Referring to FIG. 3 at (d), the optical sensor 300 includes three photodiodes PD 1, PD 2, and PD 3. A first photodiode PD 1 includes a first visible light filter arranged on its top, a second photodiode PD 2 includes a filter where the infrared blocking filter and a first visible light filter are laid and a third photodiode PD 3 does not include a filter.

Herein, the visible light filter arranged on the first photodiode PD 1 and second photodiode PD 2 respectively correspond to the infrared pass filter or the color filter, and are thus an infrared pass filter or a band pass filter. The optical sensor 300 indicates various measured values according to a kind of the visible light filter and performs various functions according to the various measured values. Table 1 presents various cases that clarify the information produced by the sensors in various use cases.

TABLE 1

| Type | The first measured value | The second measured value | The third measured value |
|---|---|---|---|
| Case 1 | IR + dark current (DC) | DC | White + IR + DC |
| Case 2 | RGB + IR + DC | RGB + DC | White + IR + DC |
| Case 3 | IR + DC | RGB + DC | White + IR + DC |

Referring to Table 1, the first through third measured values corresponds to the measured values through the first photodiode PD 1, second photodiode PD 2, and third photodiode PD 3. IR corresponds to the value of the infrared ray. RGB corresponds to the value of the monochromatic light, which may be red (R), green (G), or blue (B). White corresponds to all colors of the visible light. DC corresponds to the dark current (DC).

Case 1 represents a case in which the visible light filters arranged on the first and second photodiodes both correspond to the infrared pass filter. The second photodiode PD 2 also filters IR light.

The optical sensor 300 may perform a difference operation between the first and second measured values, by finding the value of the first measured value–the second measured value, to measure the light quantity for the infrared ray separately. Also, the optical sensor 300 performs a difference operation between the first and third measured values (i.e., the third measured value–the first measured value) to measure the light quantity of the white light.

Therefore, the optical sensor is able to accurately measure the position of the object and the ambient illuminance.

Case 2 represents a case where the visible light filters arranged on the first and second photodiodes both correspond to the color filter. The optical sensor 300 uses the first and second measured values, that is, the first measured value–the second measured value, to measure the light quantity of the infrared ray. Thus, the optical sensor 300 measures the ambient illuminance based on the first through third measured values. For example, the ambient illuminance=the third measured value–the first measured value+the second measured value, which also corrects for the DC.

Case 3 represents a case where the visible light filter arranged on the first photodiode corresponds to the infrared pass filter and the visible light filter arranged on the second photodiode corresponds to the color filter. The optical sensor 300 may measure the light quantity of the white light through an operation between the first and third measured values. Thus, white light=the third measured value–the first measured value, because this case uses this difference to remove the IR and DC from the third measured value, leaving only the white light.

In consideration of cases 1 through 3, in order to accurately measure both the position of the object and the ambient illuminance, the visible light filters arranged on the first photodiode PD 1 and second photodiode PD 2 correspond to the infrared pass filter.

Figure 4:
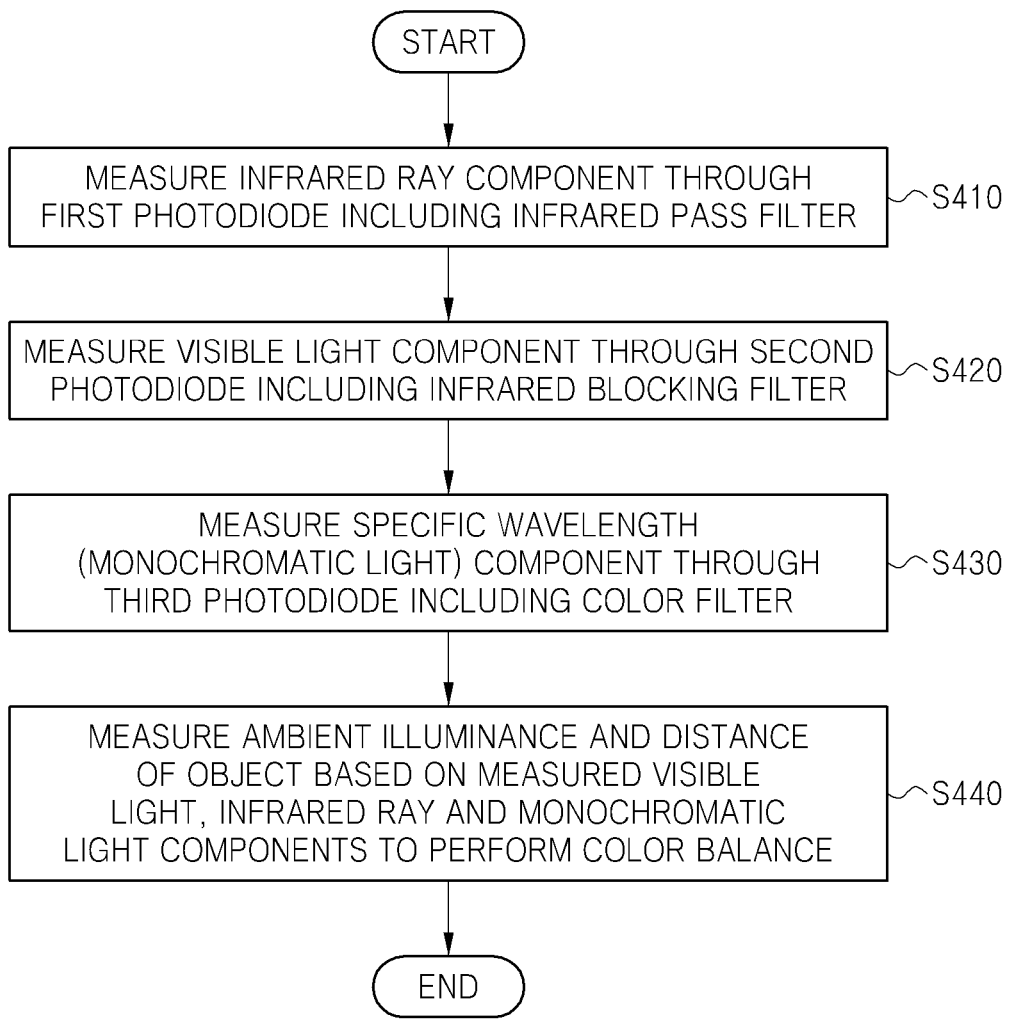
FIG. 4 is a block diagram illustrating a method for measuring an illuminance and a distance of an object that is being measured on an optical sensor.

FIG. 4 is a block diagram illustrating a method for measuring an illuminance and a distance of an object that is being measured on an optical sensor.

Referring to FIG. 4, a method for measuring the illuminance and position of the object is performed on the optical sensor 100 that includes a plurality of photodiodes.

At step S410, the method measures the infrared ray through the first photodiode PD 1 where the infrared pass filter is arranged. For example, the optical sensor 100 measures the infrared ray through the first photodiode PD 1 where the infrared pass filter is arranged.

At step S420, the method measures the visible light through the second photodiode PD 2 where the infrared blocking filter is arranged. For example, the optical sensor measures the visible light through the second photodiode PD 2 where the infrared blocking filter is arranged.

At step S430, the method measures the light quantity for the specific wavelength of the visible light through the third photodiode PD 3 where the color filter is arranged and measures the light quantity for the specific wavelength based on a third measured value measured through the third photodiode PD 3 and the first measured value. For example, the optical sensor 100 measures the light quantity for the specific wavelength of the visible light through the third photodiode PD 3 where the color filter is arranged and measure the light quantity for the specific wavelength based on a third measured value measured through the third photodiode PD 3 and the first measured value, as discussed above.

At step S440, the method measures the ambient illuminance and the position of the object based on the measured visible light, infrared ray and specific wavelength light. For example, the optical sensor 100 measures the ambient illuminance and the position of the object based on the measured visible light, infrared ray and specific wavelength light, that is, the monochromatic light.

Therefore, the optical sensor 100 is able to function as both an illuminance sensor and a proximity sensor measuring the ambient illuminance and the distance of an object and optionally also functions as the color sensor that performs a color balancing for the specific monochromatic light.

Manufacturing costs are decreased through a simplification of a structure of examples of optical sensors 100 presented herein.

The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, a hardware component may include multiple processors or a processor and a controller. In addition, different processing configurations are possible, such as parallel processors.

The methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The media may also include, alone or in combination with the software program instructions, data files, data structures, and the like. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

As a non-exhaustive illustration only, a terminal/device/unit described herein may refer to mobile devices such as, for example, a cellular phone, a smart phone, a wearable smart device (such as, for example, a ring, a watch, a pair of glasses, a bracelet, an ankle bracket, a belt, a necklace, an earring, a headband, a helmet, a device embedded in the cloths or the like), a personal computer (PC), a tablet personal computer (tablet), a phablet, a personal digital assistant (PDA), a digital camera, a portable game console, an MP3 player, a portable/personal multimedia player (PMP), a handheld e-book, an ultra mobile personal computer (UMPC), a portable lab-top PC, a global positioning system (GPS) navigation, and devices such as a high definition television (HDTV), an optical disc player, a DVD player, a Blu-ray player, a setup box, or any other device capable of wireless communication or network communication consistent with that disclosed herein. In a non-exhaustive example, the wearable device may be self-mountable on the body of the user, such as, for example, the glasses or the bracelet. In another non-exhaustive example, the wearable device may be mounted on the body of the user through an attaching device, such as, for example, attaching a smart phone or a tablet to the arm of a user using an armband, or hanging the wearable device around the neck of a user using a lanyard.

A computing system or a computer may include a microprocessor that is electrically connected to a bus, a user interface, and a memory controller, and may further include a flash memory device. The flash memory device may store N-bit data via the memory controller. The N-bit data may be data that has been processed and/or is to be processed by the microprocessor, and N may be an integer equal to or greater than 1. If the computing system or computer is a mobile device, a battery may be provided to supply power to operate the computing system or computer. It will be apparent to one of ordinary skill in the art that the computing system or computer may further include an application chipset, a camera image processor, a mobile Dynamic Random Access Memory (DRAM), and any other device known to one of ordinary skill in the art to be included in a computing system or computer. The memory controller and the flash memory device may constitute a solid-state drive or disk (SSD) that uses a non-volatile memory to store data.

TABLE 2

Description of Symbols

| Item Number | Description |
| --- | --- |
| 100, 200, 300 | Optical Sensor |
| 110 | Photodiodes |
| 120 | Optical Filters |

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An optical sensor comprising:
a first photodiode, wherein only a visible light filter is arranged on the first photodiode;
a second photodiode, wherein only an infrared blocking filter is arranged on the second photodiode; and
a third photodiode, wherein the third photodiode has no filters arranged thereon,
wherein the optical sensor performs a first difference operation between second and third measured values measured through the second and third photodiodes, respectively, to measure a distance of an object and performs a second difference operation between a result of the first difference operation and a first measured value measured through the first photodiode to measure an illuminance of a specific wavelength.

2. The optical sensor of claim 1, wherein the photodiodes are spaced apart from each other and all of the filters are spaced apart from each other.

3. The optical sensor of claim 1, wherein the visible light filter comprises:
an infrared pass filter configured to block visible light and to pass an infrared ray; and
a color filter configured to pass the specific wavelength band from the visible light band.

4. The optical sensor of claim 3, wherein the color filter comprises red, green and blue filters configured to respectively pass monochromatic light corresponding to a red color, a green color, and a blue color, and the red, green, and blue filters are laid upon each other to form the infrared pass filter.

5. An optical sensor, comprising:
a first photodiode configured to measure a light quantity of an infrared ray, wherein only a visible light filter that is an infrared pass filter passing infrared light is arranged on the first photodiode;
a second photodiode configured to measure a dark current of the second photodiode, wherein a visible light filter that is an infrared pass filter passing infrared light and an infrared blocking filter are arranged on the second photodiode; and
a third photodiode configured to measure a light quantity for a specific wavelength of a visible light wherein only a visible light filter is arranged on the third photodiode,
wherein the optical sensor performs a difference operation between the light quantity of the infrared ray measured by the first photodiode and the dark current measured by the second photodiode to measure an adjusted distance of an object, and
the optical sensor performs a difference operation between the light quantity for the specific wavelength measured by the third photodiode and the light quantity of the infrared ray measured by the first photodiode to further measure an adjusted illuminance for a specific wavelength.

6. The optical sensor of claim 5, further comprising:
a fourth photodiode configured to measure a light quantity of a visible light and an infrared ray wherein the fourth photodiode has no filters arranged thereon.

7. The optical sensor of claim 5, wherein each infrared pass filter is formed by laying upon each other a red color, a green color, and a blue color filter.

8. The optical sensor of claim 6, wherein the optical sensor measures an ambient illuminance based on the light quantity of the infrared ray measured by the first photodiode and the light quantity of the visible light and the infrared ray measured by the fourth photodiode.

9. A method of using an optical sensor, comprising:
measuring a first quantity of light in an infrared ray received through a first photodiode where only an infrared pass filter is arranged;
measuring a second quantity of light received through a second photodiode where only an infrared blocking filter is arranged;
measuring a third quantity of light received through a third photodiode where only a color filter is arranged; and
measuring the ambient illuminance and the position of an object based on the measured first, second, and third quantities of light.

10. The method of claim 9, further comprising:
performing a color balancing using the third quantity of light.

11. The method of claim 9, further comprising:
measuring a fourth quantity of light received through a fourth photodiode on which no filters are arranged; and
correcting for a dark current using the fourth quantity of light received through the fourth photodiode.

12. The sensor of claim 6, wherein the optical sensor performs a difference operation between the light quantity of the visible light and the infrared ray measured through the fourth photodiode and the light quantity of the infrared ray measured by the first photodiode to measure an adjusted ambient illuminance.

13. An optical sensor, comprising:
a first photodiode configured to measure a first measured value comprising a light quantity of an infrared ray, wherein a first visible light filter is arranged on the first photodiode; and
a second photodiode configured to measure a second measured value consisting of a dark current of the second photodiode, wherein a second visible light filter and an infrared blocking filter are arranged on the second photodiode,
wherein the optical sensor performs a difference operation between the first measured value measured through the first photodiode and the second measured value measured through the second photodiode to further measure a distance of an object based on a result of the difference operation.

* * * * *